United States Patent
Min et al.

(10) Patent No.: US 12,464,857 B2
(45) Date of Patent: Nov. 4, 2025

(54) TRANSFER RESIN FOR TRANSFERRING AN LED CHIP, AND AN APPARATUS FOR TRANSFERRING AN LED CHIP BY USING THE SAME

(71) Applicant: AGASemicon Corp., Yongin-si (KR)

(72) Inventors: Jae Sik Min, Yongin-si (KR); Jae Yeop Lee, Yongin-si (KR); Jae Suk Park, Yongin-si (KR); Byoung Gu Cho, Yongin-si (KR)

(73) Assignee: AGASemicon Corp., Yongin-si (KR)

( * ) Notice: Subject to any disclaimer, the term of this patent is extended or adjusted under 35 U.S.C. 154(b) by 695 days.

(21) Appl. No.: 17/666,218

(22) Filed: Feb. 7, 2022

(65) Prior Publication Data
US 2022/0254949 A1    Aug. 11, 2022

(30) Foreign Application Priority Data

Feb. 8, 2021  (KR) .................. 10-2021-0017708
Feb. 8, 2021  (KR) .................. 10-2021-0017715

(51) Int. Cl.
*H10H 20/01*    (2025.01)
*H01L 21/683*   (2006.01)
*H01L 25/075*   (2006.01)

(52) U.S. Cl.
CPC ......... *H10H 20/01* (2025.01); *H01L 21/6835* (2013.01); *H01L 25/0753* (2013.01);
(Continued)

(58) Field of Classification Search
CPC ............... H01L 33/005; H01L 21/6835; H01L 25/0753; H01L 2221/68318;
(Continued)

(56) References Cited

U.S. PATENT DOCUMENTS

2019/0292415 A1*  9/2019  Sato ................. C09J 7/385

FOREIGN PATENT DOCUMENTS

| CN | 108513684 A | 9/2018 |
| CN | 113906547 A | 1/2022 |

(Continued)

OTHER PUBLICATIONS

Office Action issued by the CNIPA on Mar. 22, 2025 in corresponding Chinese Patent Application No. 202210115052.8.

*Primary Examiner* — Michael A Tolin
*Assistant Examiner* — Christopher C Caillouet
(74) *Attorney, Agent, or Firm* — AJU IP Global PLLC

(57) ABSTRACT

The present invention relates to a transfer technology using a technique of transferring LED chips formed on a wafer to another carrier substrate and display panel, a transfer resin, and an apparatus for transferring an LED chip and a display panel using a resin which expands when light is applied. An apparatus for transferring an LED chip in accordance with an embodiment of the present invention, comprises: a substrate and a resin layer, formed on the substrate, which forms a photo-deteriorating layer and expands at a predetermined temperature. An LED chip is disposed on the resin layer and a lower part of the LED chip is placed in a state of being embedded in the resin layer by a clip-up structure. An adhesive force of the LED chip located in the photo-deteriorating layer is offset so that the LED chip is peeled off or transferred.

17 Claims, 14 Drawing Sheets

(52) U.S. Cl.
CPC ............... *H01L 2221/68318* (2013.01); *H01L 2221/68386* (2013.01)

(58) Field of Classification Search
CPC ....... H01L 2221/68386; H01L 33/0095; H01L 2221/68322; H01L 2221/68354; H01L 33/48; H01L 21/67132; H01L 2933/0033
See application file for complete search history.

(56) References Cited

FOREIGN PATENT DOCUMENTS

| | | | |
|---|---|---|---|
| CN | 110797295 | A | 9/2022 |
| JP | 2003307751 | A | 10/2003 |
| JP | 2019015899 | A | 1/2019 |
| KR | 100853410 | B1 | 8/2008 |
| KR | 1020120022588 | A | 3/2012 |
| KR | 20200019133 | A | 2/2020 |
| KR | 1020200086656 | A | 7/2020 |

* cited by examiner

TRANSFER RESIN FOR TRANSFERRING AN LED CHIP, AND AN APPARATUS FOR TRANSFERRING AN LED CHIP BY USING THE SAME

CROSS-REFERENCE TO RELATED PATENT APPLICATIONS

The present application claims priority to Korean Patent Application No. 10-2021-0017708 filed Feb. 8, 2021 and Korean Patent Application No. 10-2021-0017715 filed Feb. 8, 2021. The disclosures of the aforementioned priority applications are incorporated herein by reference in their entireties.

TECHNICAL FIELD

The present invention relates to a transfer technology using a technique of transferring LED chips formed on a wafer to another carrier substrate and display panel, and a transfer resin for an LED chip and an apparatus for transferring an LED chip to which a technique of selectively, sequentially or at time intervals transferring some of each chip mounted on a substrate to another carrier substrate and a display panel using a resin which expands by light is applied.

BACKGROUND

A light emitting diode (LED) is one of light emitting elements that emit light when a current is applied. The light emitting diode may emit high-efficiency light at a low voltage, thereby having an excellent energy saving effect.

Recently, the luminance problem of the light emitting diode has been greatly improved. Accordingly, the light emitting diode is applied to various devices such as a backlight unit of a liquid crystal display device, an electronic display plate, an indicator, and home appliance.

The size of the micro light emitting diode (μ-LED) is very small at the level of 1 to 100 μm, and more than 25 million pixels are required to implement a 40-inch display device.

Therefore, a simple Pick & Place method takes at least a month to make a 40-inch display device.

A plurality of conventional μ-LEDs are manufactured on a sapphire substrate, and then micro light emitting diodes are transferred one by one to a glass or flexible substrate by a mechanical transfer method.

Since the μ-LEDs are picked up and transferred one by one, it is referred to as a 1:1 pick-up and place transfer method.

However, since the size of the μ-LED chip manufactured on the sapphire substrate is small and thin, there occurs such problems as damage to the chip, failure to transfer the μ-LED chip one by one, failure to align the chip, or tilt of the chip, and so on, during the pick and place transfer process transferring the μ-LED chip one by one.

In addition, there is a problem that the transfer process takes too long.

Japanese Patent Application Publication No. 2019-015899 discloses a technique of expanding thermally expandable particles to weaken the adhesive force and exfoliating the same as a transfer method of chip parts, but there are problems such as uniform mixing of thermally expandable particles and technology of ensuring uniform adhesive force.

BRIEF SUMMARY

The present invention is to provide a resin and an apparatus for transferring an LED chip capable of entirely or selectively transferring a plurality of chips formed or disposed on a base substrate by using the phototactivity and expandability of the resin.

In addition, the present invention provides a method for selectively transferring a plurality of chips formed on a base substrate using a predetermined resin.

In addition, the present invention is to manufacture a display device having various pitches by enabling transfer of a micro-unit LED chip for each required size without errors.

An object to be achieved by the present invention is not limited to the above-mentioned objects, and other objects not mentioned will be clearly understood by those skilled in the art from the following description.

The resin for transferring an LED chip according to the embodiment of the present invention is made by a transfer resin prepared by mixing a resin, an organic solvent, and a photoactive solution. It is possible to transfer an LED chip to a substrate by making adhesive force of the LED chip adhered to the resin to be broken or offset by expanding the resin by heating after exposure by using expandability of the photoactive agent.

Here, the transfer resin may be exposed to a specific region by mask and UV irradiation to form a photo-deteriorating layer, and the photo-deteriorating layer may be expanded by applying predetermined heat to selectively transfer only the LED chip located at the photo-deteriorating layer.

The transfer resin further includes a solvent. The base resin is 30 to 35 wt %, the organic solvent is 45 to 50 wt %, the solvent is 5 to 10 wt %, and the photoactive agent is 10 to 15 wt %.

The base resin is selected from at least one resin selected from a phenol resin, an epoxy resin, a UV resin, a polyester resin, a polyurethane resin, or an acrylic resin.

The organic solvent is selected from at least one organic solvent selected from alcohols, petroleum-based materials, aromatic solvents, ketones, glycol ethers, acetates, and DMCs.

The photoactive agent is selected from Oxime-ester based, s-Triazine based, or Phosphineoxide based photoinitiators.

A filler for reinforcing the adhesive force of the LED chip is added to the transfer resin.

Ultrapure (DI) water is added to the transfer resin.

An apparatus for transferring an LED chip in accordance with an embodiment of the present invention, comprises: a substrate; and a resin layer formed on the substrate and formed of a resin which is exposed to a specific region by UV irradiation to form a photo-deteriorating layer and expands at a predetermined temperature. An LED chip is disposed on the resin layer, and a lower part of the LED chip is placed in a state of being embedded in the resin layer by a clip-up structure. The photo-deteriorating layer is expanded by applying predetermined heat, and an adhesive force of the LED chip located in the photo-deteriorating layer is offset so that the LED chip is peeled off or transferred.

The resin is manufactured by mixing a base resin, an organic solvent, and a photoactive agent.

The resin is exposed to a specific area by mask and UV irradiation to form a photo-deteriorating layer, and expands the photo-deteriorating layer by applying predetermined heat to selectively transfer only an LED chip positioned in the photo-deteriorating layer.

The resin further comprises a solvent.

A filler for reinforcing the adhesive force of the LED chip is added to the resin.

Ultrapure (DI) water is added to the resin.

According to the aforementioned configuration of the present invention, there is an advantage in that a plurality of chips formed or disposed on a base substrate may be selectively transferred using predetermined UV and heat.

In addition, the photo-induced deterioration layer is formed through target exposure of a predetermined resin layer on a plurality of chips formed on a base substrate, and then expanded by applying heat thereto, thereby providing a resin capable of transferring by offsetting an adhesive force of an LED chip.

In addition, it is possible to provide the photoactive agent (photinitiator) as a transfer resin by using deterioration characteristics and expansion characteristics, thereby increasing manufacturing ease, lowering manufacturing cost, and zero transfer errors of LED chips in micro units.

In addition, it is possible to have a clip-up structure that allows the LED chip to be embedded in the resin to minimize peeling of the LED chip adhered to the resin, thereby eliminating errors in display panel fabrication due to peeling or detaching of the LED chip before transfer.

DETAILED DESCRIPTION OF THE INVENTION

Figure 1A:
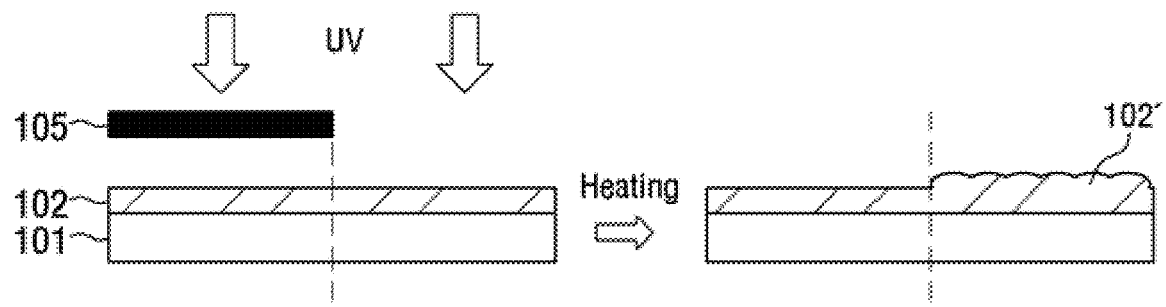
FIGS. 1A and 1B are schematic diagrams illustrating an LED chip transfer method according to an embodiment of the present invention.

In the description of the embodiment, when described as being formed "upper (top) or lower (bottom)" of each element, two elements are directly in contact with each other or at least one other element is disposed between the two elements. In addition, when expressed as "up (up) or down (down)", it may include not only upward but also downward meanings with respect to one element.

In the drawings, the thickness or size of each layer is exaggerated, omitted, or schematically illustrated for convenience and clarity of description. In addition, the size of each element does not fully reflect the actual size.

Chip, CSP, LED pixel CSP, and LED subpixel CSP used in the present invention may be defined as follows.

A chip is a concept that includes all of an LED chip, an RGB chip, an R chip, a G chip, a B chip, a mini LED chip, and a micro LED chip. Hereinafter, for convenience of description, the chip is described as an R chip, a G chip, or a B chip, but it should be noted that the chip is not limited to an R chip, a G chip, or a B chip.

A chip scale package (CSP) is a package that has recently attracted great attention in the development of a single chip package and refers to a single chip package with a semiconductor/package area ratio of 80% or more.

The LED pixel CSP refers to a single package in which one LED pixel is CSP packaged using a red LED, a green LED, and a blue LED in units of one pixel.

The LED subpixel CSP refers to a single package in which each of the Red LED, Green LED, and Blue LED is CSP packaged in one LED subpixel unit.

The light emitting body formed on the wafer may be defined as an LED chip.

Figure 1B:
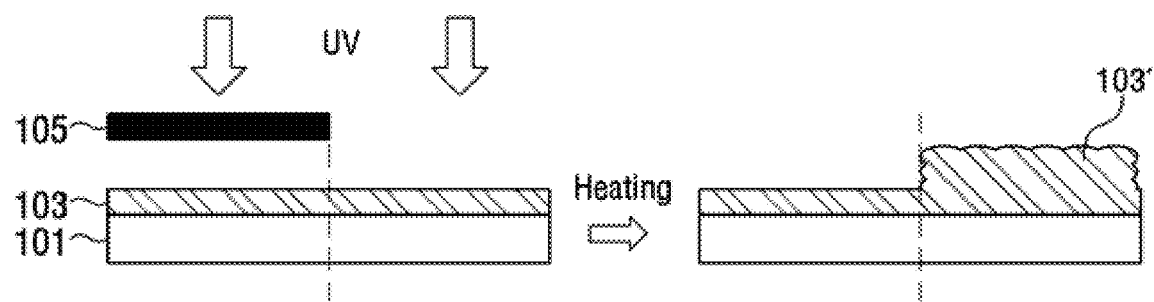

FIGS. 1A and 1B are a schematic diagrams illustrating an LED chip transfer method according to an embodiment of the present invention.

The present invention uses the deterioration properties and expandability of photoactive agents. That is, when UV is irradiated to the base resin, photoreaction occurs in internal novolac resins and photoactive agents, and acid is generated. When the wafer is raised on the Hop plate in a liquid state and the temperature is applied, only the UV-irradiated area of the acid is expanded, and the expansion occurs when the volume of the liquid Acid trapped inside the resin is rapidly increased by heat. Here, a photoactive agent is added to increase the expansion force of the base resin so that the LED chip can be transferred. Accordingly, by increasing the amount of Acid and increasing the resin expansion force, the cause of the defect during transfer is prevented.

FIG. 1A is a schematic diagram of the degree of expansion of the resin by UV irradiation and heating when the content of the photoactive agent is relatively small, and FIG. 1B is a schematic diagram of the degree of expansion of the resin by UV irradiation and heating when the content of the photoactive agent is relatively large.

The resin of the present invention may be made of a photosensitive resin in which a base resin, an organic solvent, and a photoactive agent are mixed. By expanding the resin by heat after exposure using the expandability of the photoactive agent, the adhesive force of the LED chip adhered to the resin may be broken or offset to transfer the LED chip to the substrate.

The base resin may be selected from at least one resin among a phenol resin, an epoxy resin, a UV resin, a polyester resin, a polyurethane resin, or an acrylic resin, and as a preferred embodiment, novolac resin may be applied among the phenol resins.

The organic solvent may be selected from at least one solvent among alcohols, petroleum-based materials, aromatic solvents, ketones, glycol ethers, acetates, or DMCs, and acetate, acetone, or PGMEA may be applied as a desirable embodiment.

The photoactive agent refers to a substance in a comprehensive sense referring to any one of a photoacid diverging agent (PAG, Photo Acid Generator), a PAC (Photo Active compound), a photoinitiator, a photosensitive compound, and a photoactive compound.

The photoactive agents may be Oxime-ester-based, s-Triazine-based, and Phosphineoxide-based photoinitiators, and a PAC material comprising one or more of them, and in a preferred embodiment of the present invention, an ester compound of 2-diazo-1-naphthone-5-sulfonic acid chloride may be applied among the ester-based materials.

FIG. 1A shows a resin synthesized with equal to or smaller than 2% by weight of a photoactive agent, and FIG. 1B shows a resin synthesized with equal to or larger than 6% by weight of a photoactive agent. The resins 102 and 103 are coated on the substrate 101, and the mask 105 is disposed on the upper side thereof to irradiate UV. The resins 102 and 103 expand in the region to which the UV is irradiated, and the resins 102 and 103 do not expand in the region to which the UV is not irradiated. That is, according to the mask pattern, the adhesive force of the LED chip attached to the resins 102 and 103 becomes zero selectively according to the presence or absence of the region of UV irradiation, so that the LED chip may be selectively transferred to another substrate.

However, in the case of FIG. 1A, it is difficult to perform a transfer function completely due to the weak expansion force of the resin 102', and in the case of FIG. 1B, the resin 103' has an expansion force enough to reduce the adhesive force of the LED chip to transfer to another substrate. As a result, a considerable amount of photoactive agent solution is mixed with the resin to form an exposed region by UV irradiation, and heat is applied to the exposed region to expand the resin of the exposed region. By doing so, it becomes possible to peel off the LED chip adhered to the exposed region or to transfer the LED chip onto another substrate. In addition, the resin only undergoes an exposure process, and it is possible to implement a material as a new application (LED chip transfer application) that does not undergo a development process.

Figure 2:
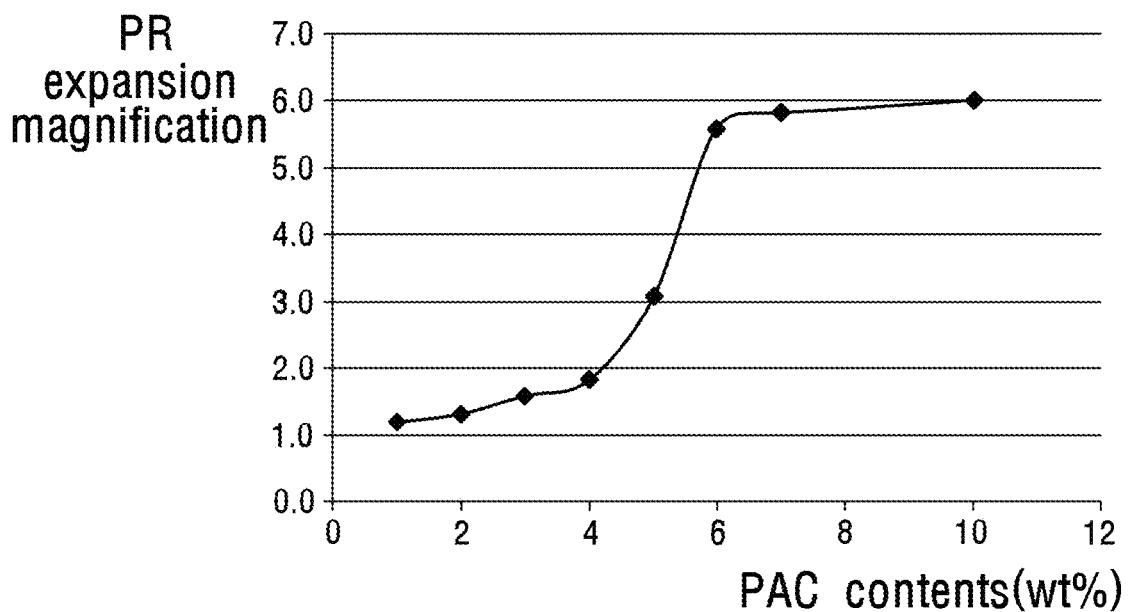
FIG. 2 is a graph illustrating an expansion magnification according to a content of a photoactive agent in the resin illustrated in FIGS. 1A and 1B.

FIG. 2 is a graph illustrating an expansion magnification according to a content of a photoactive agent in the resin illustrated in FIGS. 1A and 1B. FIG. 2 is a graph showing the result of experimentally verifying the content of the photoactive agent in the resin and the expansion magnification of the resin. The result values of the graph shown in FIG. 2 are shown in Table 1, and these indicate a relative value when heat is applied at the same UV irradiation amount and at the same temperature.

TABLE 1

| | PAC content (wt %) | | | | | | | |
|---|---|---|---|---|---|---|---|---|
| | 1 | 2 | 3 | 4 | 5 | 6 | 7 | 10 |
| Expansion magnification (times) | 1.2 | 1.3 | 1.6 | 1.8 | 3.1 | 5.6 | 5.8 | 6.0 |

It may be seen that the slope value is inclined at a range of about 4 wt % to about 6 wt %, and it may be seen that the expansion force of the maximum efficiency according to the PAC content is within this range. As a result, when the PAC content is 4 to 6 wt %, the expansion magnification of the resin has an expansion force of 1.8 to 5.6 times, and this expansion force makes the adhesive force of the adhered LED chip becomes zero, and this value may be recognized as a physical value for complete transfer.

When the PAC content is equal to or larger than 10 wt %, the expansion magnification is shown to converge 6.0 times, and thus, when the PAC content is equal to or larger than 4 wt %, it can be seen that expansion for LED chip transfer occurs.

However, when looking at the expansion magnification alone, there is no significant difference in the expansion rate at 6 wt % or more, but if the PAC content is taken to 6 wt % or more, for example, 12.7 wt %, the defect rate is significantly reduced. This reduction in defect rate can be confirmed through repeated experiments because the fineness (or density) of the resin increases as the PAC content increases. In a real case, 12.7 wt % of the PAC content increases by 20% compared to 4-6 wt %, and this increase in density aids in minimizing transfer defects of LED chips in expansion transfer.

The resin of the present invention may further include a solvent (acetone) and may be a mixed resin prepared by mixing of the base resin 30 to 35 wt %, the organic solvent 45 to 50 wt %, the solvent 5 to 10 wt %, and the photoactive agent 10 to 15 wt %, preferably.

More fillers can be added to the resin of the present invention to increase the rigidity of the resin, and more ultrapure water (DI Water) that plays an auxiliary role in improving the foaming performance can be added. The filler may be selected from SiOF series, SiOF2 series, SiOF3 series, and the like, and as a preferred embodiment, a filler with a size of 3 um level may be used in the SiOF3 series. The filler may be 0.1 wt % to 10 wt %, and ultrapure water may be mixed 0.1 wt % to 10 wt %.

Figure 3:
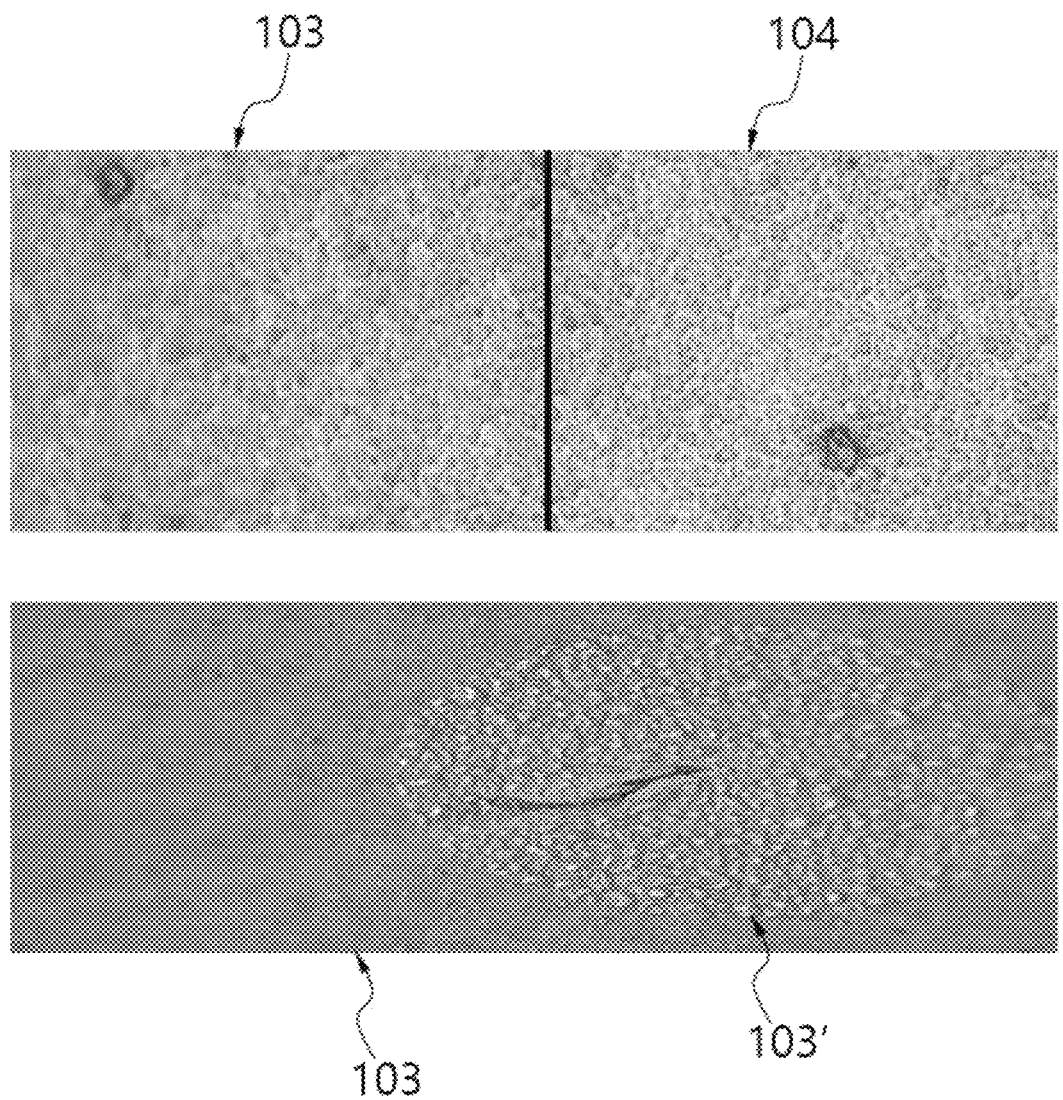
FIG. 3 is a photograph illustrating an expanded state of a resin applied to the transfer of an LED chip according to an embodiment of the present invention.

FIG. 3 is a photograph illustrating an expanded state of a resin which is applied to the transfer of an LED chip according to an embodiment of the present invention. A typical material of the resin applied to the present invention may be a naphthoquinone diazide-novolac resin.

When the resin is mixed with equal to or larger than 4 wt % of a photoactive agent and irradiated with light, ketene with good reactivity is formed, and a positive image 104 is formed according to a reaction mechanism in which solubility is increased in a developer by the influence of nitrogen gas generated and the carboxylic acid formed by reacting ketene with moisture.

In the photograph of FIG. 3, the upper left photograph is a photograph 103 of a resin before UV irradiation, and the upper right photograph is a photograph in which a positive image 104 is formed by irradiating UV.

The lower photograph is an enlarged photograph of the positive image, that is, a portion in which the expansion region 103' is formed by irradiating UV. This expansion region can be expanded at a specific position through a patterned mask and can be implemented to have the maximum efficient expansion magnification by calculating an optimal mixing ratio of a photoactive agent. In addition, the expansion force by heat which the resin in accordance with the embodiment of the present invention uniquely has may serve to peel off or transfer the LED chip by disrupting the adhesive force of the LED chip.

Figure 4A:
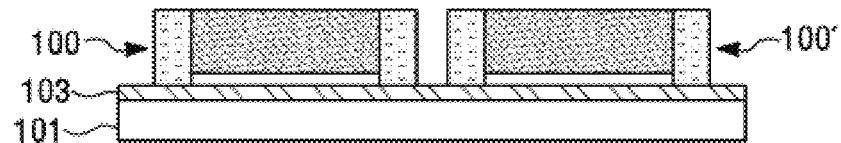
FIGS. 4A to 4D illustrate an apparatus for transfer using an LED chip transfer resin according to an embodiment of the present invention.
Figure 4B:
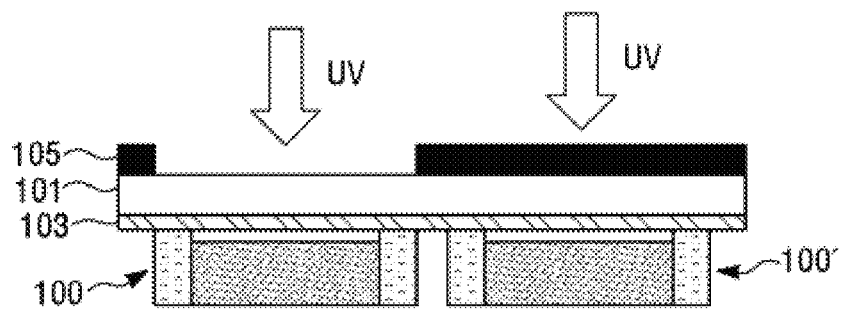
Figure 4C:
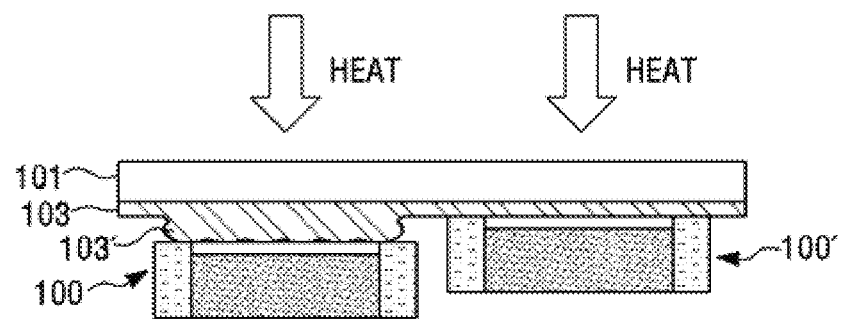
Figure 4D:
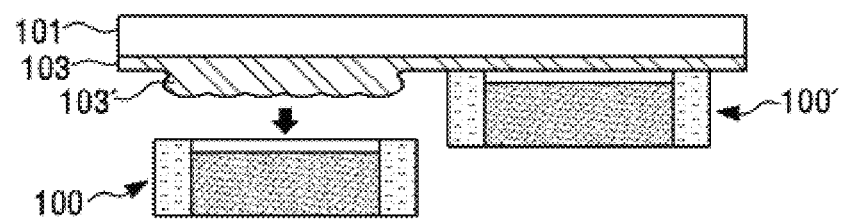

Based on FIGS. 1 to 3, how the transfer process is actually performed will be described in detail with reference to FIGS. 6A to 6D. In addition, a transfer process from a wafer to a display panel will be described in more detail with reference to FIGS. 7 to 17C. In particular, the structure of the transfer device according to an embodiment of the present invention will be described again with reference to FIGS. 4A to 5.

FIGS. 4A to 4D are a schematic diagrams of an apparatus for transferring using an LED chip transfer resin according to an embodiment of the present invention. Referring to FIGS. 4A to 4D, an apparatus for LED chip transfer using an LED chip transfer resin according to an embodiment of the present invention may include a substrate 101 and a resin layer 103 formed on the substrate 101, being made of a resin a specific region of which is exposed by UV irradiation to form a photo-deterioration layer and expands at a predetermined temperature. The LED chip 100 is disposed on the resin layer 103 by a predetermined adhesive force of the resin layer. In the case of 4A, the LED chip 100 is disposed on the upper surface of the resin layer 103, and in the case of 4B, the LED chip 100 is embedded into the resin layer 103.

In the present invention, in order to prevent the LED chip 100 from being easily separated or delaminated from the substrate, it is desired to be improved from the structure 4A to the structure 4B. Since the lower part of the LED chip 100 is embedded in the resin layer 103 and has a clip-up structure, the slope of the LED chip 100 becomes a structure held by the resin by the clip-up structure of the resin layer 103, thereby preventing easy separation or peeling off from the substrate before transfer. In this state, when UV is applied to form a photo deterioration layer, and predetermined heat is applied to the photo deterioration layer, the photo deterioration layer is expanded, and the adhesive force of the LED chip positioned in the photo deterioration layer is offset, so that the LED chip is peeled off or transferred.

Figure 5:
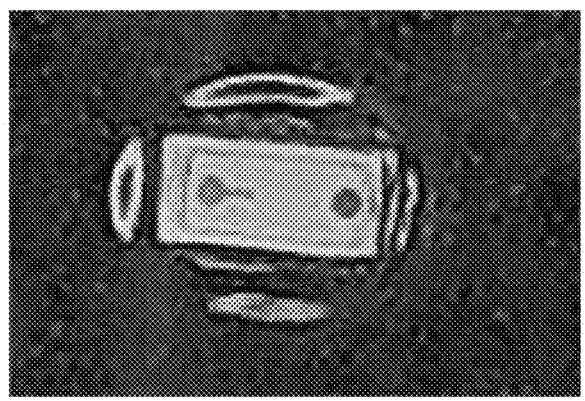
FIG. 5 is an enlarged photograph of a structure in which an actual LED chip is embedded in a resin according to the implementation schematic diagrams of FIGS. 4A to 4D.

FIG. 5 shows an enlarged photograph of a structure in which an actual LED chip is embedded in a resin according to an embodiment schematic diagram of FIGS. 4A to 4D.

FIGS. 6A to 6D illustrate an LED chip transfer method according to an embodiment of the present invention. As illustrated in FIGS. 6A to 6D, the LED chip transfer apparatus according to the present invention may include a substrate 101, a resin layer 103, and LED chips 100 and 100'.

The LED chips 100 and 100' may refer to RGB LED chips, R LED chips, G LED chips, B LED chips, and Chip Scale Packages (CSP). The LED chip pixel CSP may refer to a single package in which one LED pixel is CSP packaged. The LED subpixel CSP may refer to a single package obtained by CSP packaging each of the Red LED, Green LED, and Blue LED in one subpixel unit.

The substrate 101 may be made of any one of glass, quartz, artificial quartz, and metal, and is not particularly limited.

The resin layer 103 may be a resin material containing equal to or larger than 4 wt % of a photoactive agent. As described above, in order to increase the defect rate by increasing the density, the content of the photoactive agent may be set to 10 wt % or more and preferably 12.7 wt %.

A process of peeling or transferring the LED chips 100 and 100' at a specific location will be described with reference to FIGS. 6A to 6D.

Figure 6A:
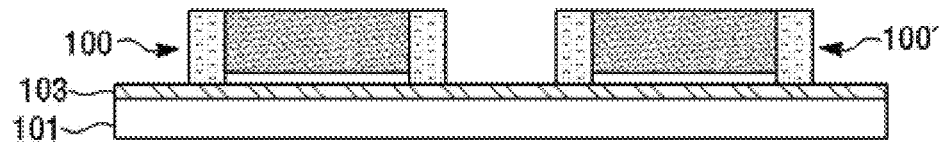
FIGS. 6A to 6D illustrate an LED chip transfer method according to an embodiment of the present invention.

Referring to FIG. 6A, a resin layer 103 is formed on the substrate 101, and LED chips 100 and 100' are disposed or transferred (meaning transfer from another substrate) on the resin layer 103.

Figure 6B:
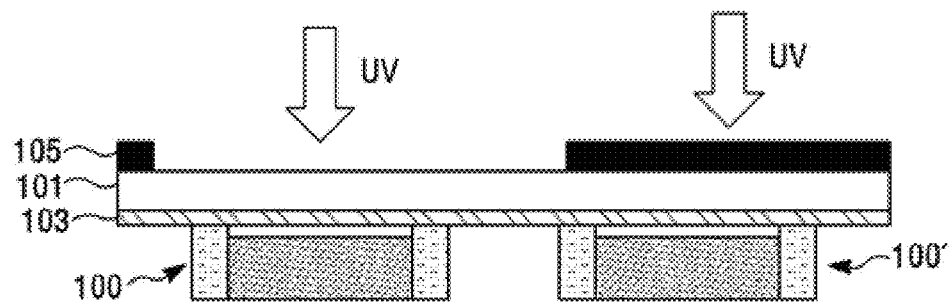

Referring to FIG. 6B, a mask 105 for forming a pattern is disposed on a rear surface side of the substrate 101, and UV is irradiated through the mask 105. The resin region exposed by mask 105 and UV irradiation is exposed by light as illustrated. By mask 105 and UV irradiation, the resin has an exposed area and a non-exposed area.

Figure 6C:
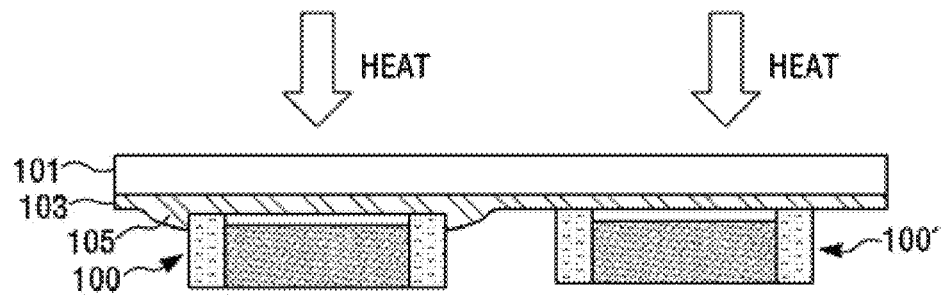

Referring to FIG. 6C, when heat is applied from the rear surface side of the substrate 101 to a predetermined temperature, the exposed region in the resin layer 103 expands and the volume thereof expands, and the expanded expansion region 103' reduces adhesion of the LED chip 100 to zero. Conversely, since there is no expansion in the unexposed region 103, the adhesive force to be adhered to the LED chip 100 is maintained as it is.

Figure 6D:
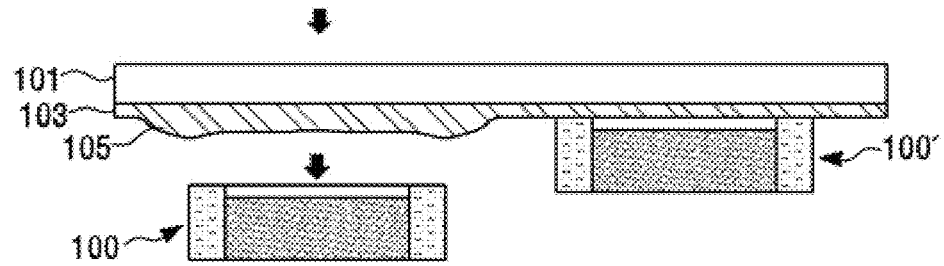

Referring to FIG. 6D, the LED chip 100 adhered to the corresponding position is peeled off, and when there is a target substrate on the opposite side, it may be transferred to the target substrate. And, the LED chip 100' adhered to another position (a position other than the expansion region) is placed on the substrate as it is. Therefore, it is possible to selectively peel or transfer the LED chip as necessary. Here, according to the resin, it is basically different from the photosensitive resin in the semiconductor process such as pattern formation in that there is only an exposure process by UV and an expansion process by heat, but no development process is performed.

Hereinafter, a method of transferring to a display panel using the LED chip transfer apparatus described above will be described in detail with reference to FIGS. 7 to 17C.

Figure 7:
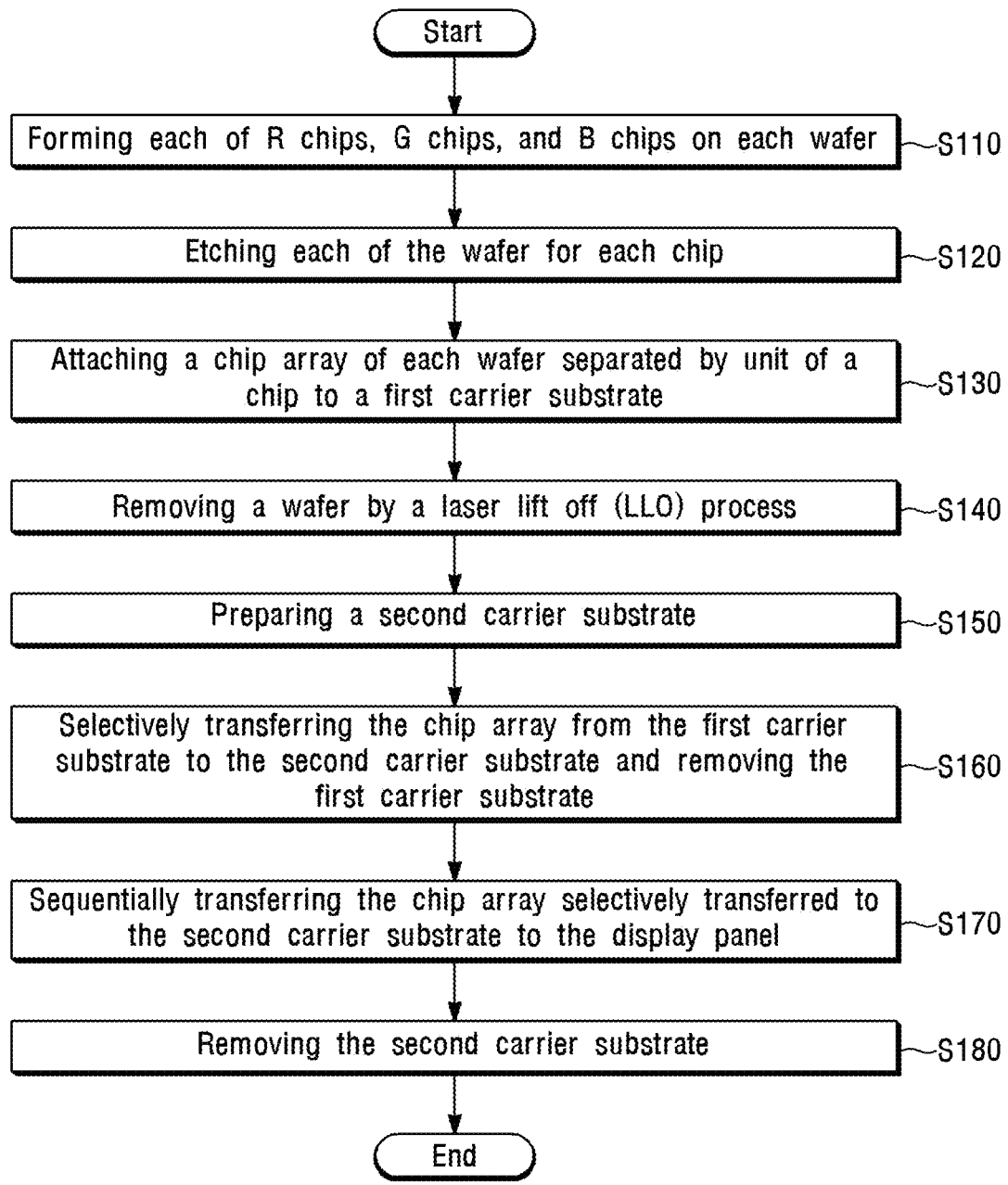
FIG. 7 is a flowchart illustrating a method of manufacturing a display device according to an embodiment of the present invention.

FIG. 7 is a flowchart illustrating a method of manufacturing a display device according to an embodiment of the present invention. Referring to FIG. 7, a method of manufacturing a display device according to an embodiment of the present invention includes the following steps: a step S110 of forming each of a plurality of chips on each wafer; a step S120 of etching the wafer for each chip; a step S130 of attaching a chip array of each wafer separated by unit of a chip to a first carrier substrate; a step S140 of removing a wafer by a laser lift off (LLO) process; a step S150 of preparing a second carrier substrate; a step S160 of selectively transferring the chip array from the first carrier substrate to the second carrier substrate; a step S170 of sequentially transferring the chip array selectively transferred to the second carrier substrate to the display panel; and a step S180 of removing the second carrier substrate.

A specific embodiment is as follows. Before step S130, a step of preparing a photoactive agent solution may be added. The photoactive agent solution is prepared by mixing acetone and a photoactive agent (PAC). The resin layer is prepared by mixing base resin and a PAC solution.

In step S130, a resin layer of the prepared resin and PAC solution is coated on the first carrier substrate by a spin coating process. The coated resin layer is first soft cured at 105° C. for 90 seconds, and then second soft cured at 105° C. for 60 seconds. In step S130, the prepared resin layer is heated at 105 degrees for 60 seconds to transfer the LED chip on the wafer to the first carrier substrate.

In step S150, an expandable micro-capsule (EMC) adhesive layer in which a foam and an adhesive are mixed is applied on a glass substrate to prepare a second carrier substrate or to attach a heat peeling film.

In step S160, the second carrier substrate is coupled to the opposite side of the first carrier substrate, aligned using a mask aligner, and then UV of 2,000 mJ is irradiated, and heated to 100° C. for 20 seconds to heat and expand the resin layer on the first carrier substrate. In this case, the first carrier substrate is separated, and the transfer of the LED chip to the second carrier substrate is completed.

In steps S170 and S180, a TFT array is prepared, a solder paste is applied, and then the second carrier substrate and the TFT array are coupled. It is heated to 200 degrees for 90 seconds to foam the foam of the EMC adhesive layer of the second carrier substrate to separate the second carrier substrate and transfer the LED chip onto the display substrate (TFT array).

Figure 8:
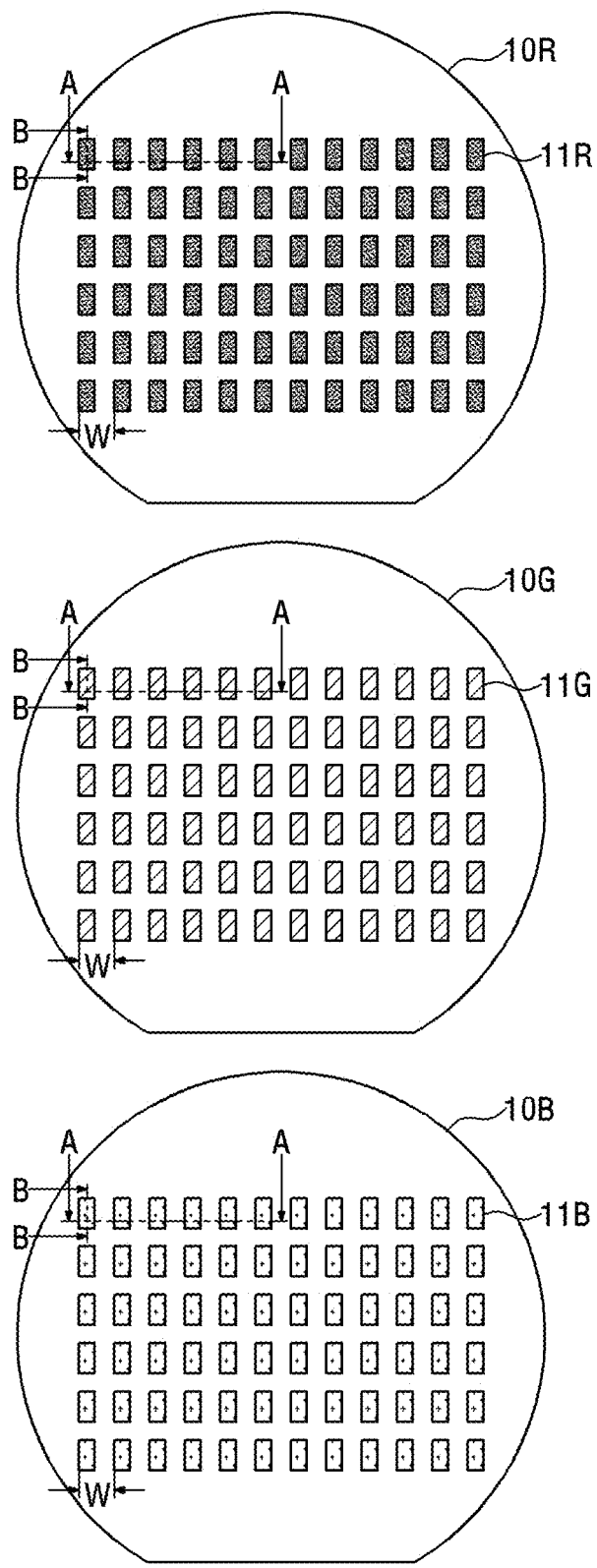
FIG. 8 is a view illustrating chips formed on each wafer according to an embodiment of the present invention.

FIG. 8 is a view illustrating chips formed on each wafer according to an embodiment of the present invention. As shown in FIG. 8, an embodiment of the present invention describes, as examples, three wafers each having an R chip, a G chip, and a B chip, but is not limited thereto.

Referring to FIG. 8, a plurality of light emitting elements 11R, 11G, and 11B emitting light of the same wavelength band are formed on each one of the wafers 10R, 10G, and 10B. Here, the light emitting elements 11R, 11G, and 11B may be light emitting chips that emit red, green, and blue light. A plurality of light emitting elements 11R, 11G, and 11B may be arranged on each of the wafers 10R, 10G, and 10B at equal intervals along a plurality of rows and columns. The light emitting elements 11R, 11G, and 11B disposed at equal intervals are then transferred to the display panel in a row or column direction. Therefore, it is possible to reduce the manufacturing cost of a light emitting device by efficiently utilizing the entire area of the relatively expensive wafer. Meanwhile, after forming a plurality of chips on each one of the wafers 10R, 10G, and 10B, the wafers may be separated for each chip through an etching process.

It is preferable that the pitch W between chips formed on each wafer 10R, 10G, and 10B is the same as the pitch between chips formed on the display panel or is set as a multiple of a proportional constant of a predetermined value. This may facilitate transfer when chips are selectively transferred in units of matrix from a second carrier substrate to a display panel as described later.

Figure 9:
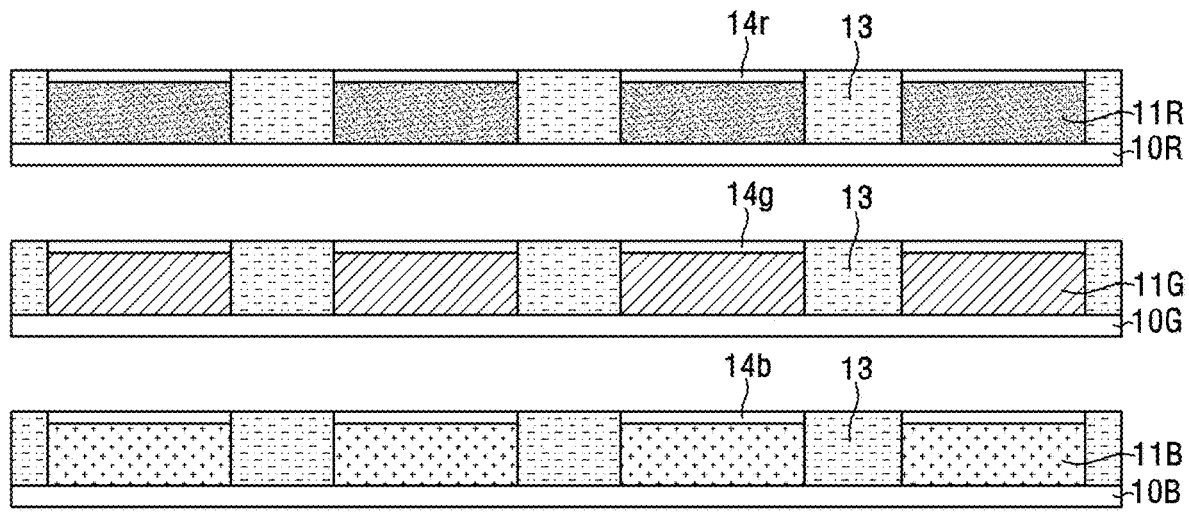
FIG. 9 is a process diagram of growing each Epi on each wafer according to an embodiment of the present invention.
Figure 9:
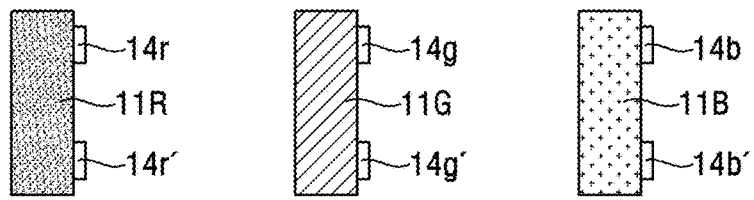

FIG. 9 is a process diagram of growing each Epi on each wafer according to an embodiment of the present invention. Referring to FIG. 9, Epis 11R, 11G, and 11B for emitting predetermined light are grown on one surface of each of the three wafers 10R, 10G, and 10B. Here, the wafers 10R, 10G, and 10B may be any one of sapphire $Al_2O_3$, silicon, gallium arsenide (GaAs), gallium nitride (GaN), and zinc nitride (ZnN). However, the present invention is not limited thereto, and any substrate that may be used as a wafer may be used.

Pads 14r, 14g, and 14b are formed on each of the grown Epis 11R, 11G, and 11B, and a protective layer 13 for passivation of the Epis 11R, 11G, and 11B and the pads 14r, 14g, and 14b is formed. Here, the pads 14r, 14g, and 14b are not expanded and may have a general pad size and shape. When forming the protective layer 13, it is preferable to form the pads 14r, 14g, and 14b to be exposed to the outside of the protective layer 13 in order to expand the area of the pad thereafter.

FIG. 9 shows cross-sectional views of A-A Section and B-B Section in FIG. 8, respectively. Preferably, a pair of (+) and (−) electrodes is formed for each chip under the Epi layer, and the electrodes may be formed vertically with respect to A-A section and may be formed left and right as necessary.

The light emitting bodies formed on the wafers 10R, 10G, and 10B are electrically separated in units of chips, and in the present invention, they are referred to as LED chips and then transferred from wafers 10R, 10G, and 10B to the first carrier substrate.

Figure 10:
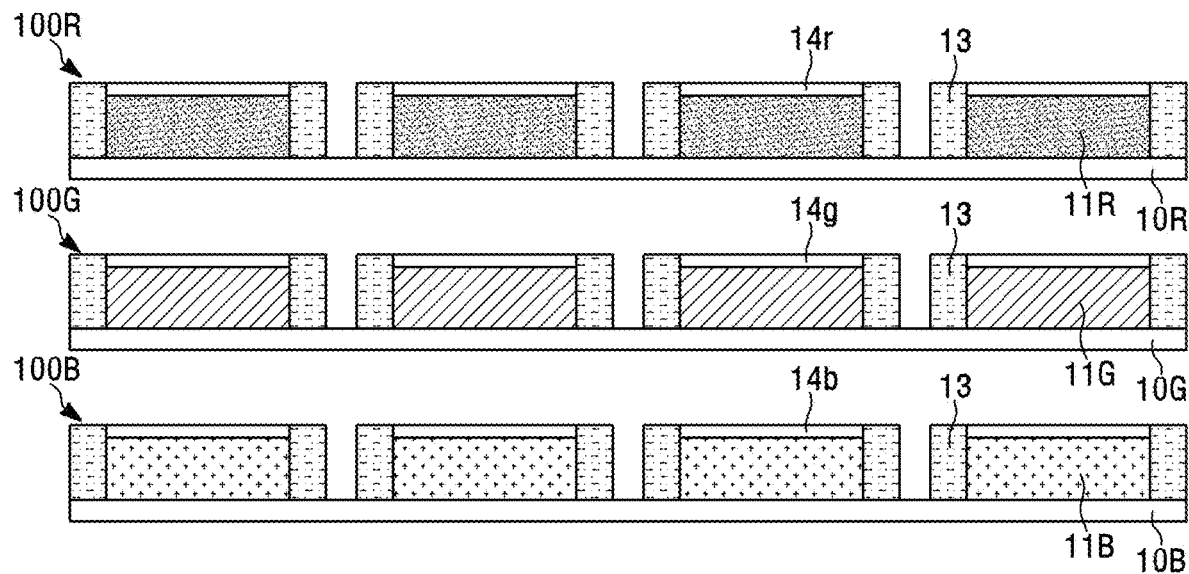
FIG. 10 is a process diagram of etching each chip formed on each wafer in a single chip unit according to an embodiment of the present invention.

FIG. 10 is a process diagram illustrating etching of each chip formed on each wafer in units of one chip according to an embodiment of the present invention. Referring to FIG. 10, Epis 11R, 11G, and 11B and pads 14r, 14g, and 14b are formed on wafers 10R, 10G, and 10B as shown in FIG. 9, and a plurality of physically separated chips 100R, 100G, and 100B are formed by etching the protective layer 13 for each chip. Here, the protective layer 13 surrounding each chip and the chip is referred to herein as a chip. Of course, the protective layer 13 surrounding each chip and the chip may also be referred to as a pixel CSP or a sub-pixel CSP. Here, in the etching process for each chip 100R, 100G, and 100B, wet or dry etching may be applied, and the shape of the LED chip is defined by the etching, and at this time, the wafers 10B, 10G, and 10B remain as they are.

In the following drawings, one chip 100R, 100G, and 100B is illustrated as a chip 100R, 100G, and 100B formed in FIG. 8, but is not limited thereto, and may be an array of chips 100R, 100G, and 100B etched in a row and column direction in FIGS. 6A to 6D. Each of the chips 100R, 100G, and 100B may have a flip chip structure in which wires are unnecessary. Instead of the wire, it may be electrically connected to the pads 14r, 14g, and 14b, and each of the chips 100R, 100G, and 100B may emit light of various colors according to external control signals through the pads 14r, 14g, and 14b.

In addition, in the present invention, each of the chips 100R, 100G, and 100B may be configured with subpixels for each R, G, and B to be packaged in a small size as a new concept manufactured in the form of CSP. The R chip 100R, the G chip 100G, and the B chip 100B may constitute one light emitting element or a light emitting body.

By attaching each of the chips 100R, 100G, and 100B to the first carrier substrate in a plurality of rows and columns directions, a pre-process capable of transferring the chip array may be performed, selectively transferring from the first carrier substrate to the second carrier substrate, and the chip array arranged on the second carrier substrate may be sequentially transferred to a display panel to be described later.

As shown in FIG. 10, a process is performed where chip arrays etched in the form of chips 100R, 100G, and 100B are attached to a carrier substrate to remove wafers on each wafer 10B, 10G, and 10B. Thereafter, a process of selectively transferring from the first carrier substrate to the second carrier substrate and sequentially selectively transferring to the display panel will be described.

The following drawings will be described based on row (horizontal) arrangement in a chip array arranged in a matrix on the wafer of FIG. 8.

Figure 11:
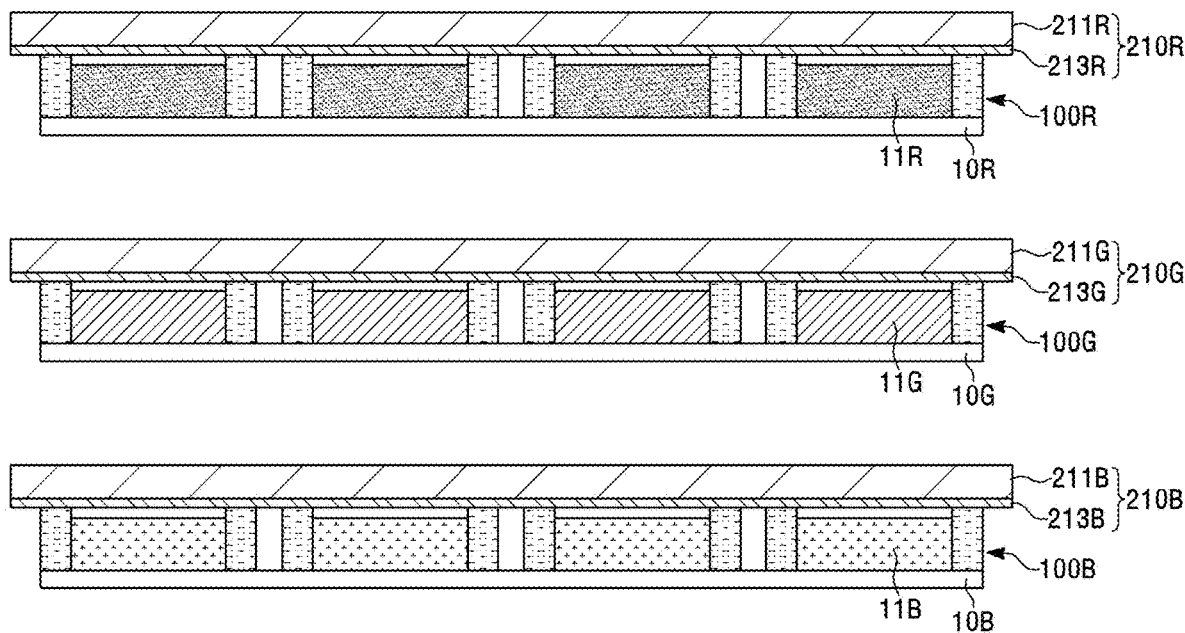
FIG. 11 is a process diagram of transferring the etched chip of FIG. 8 from a wafer to a first carrier substrate.
Figure 12:
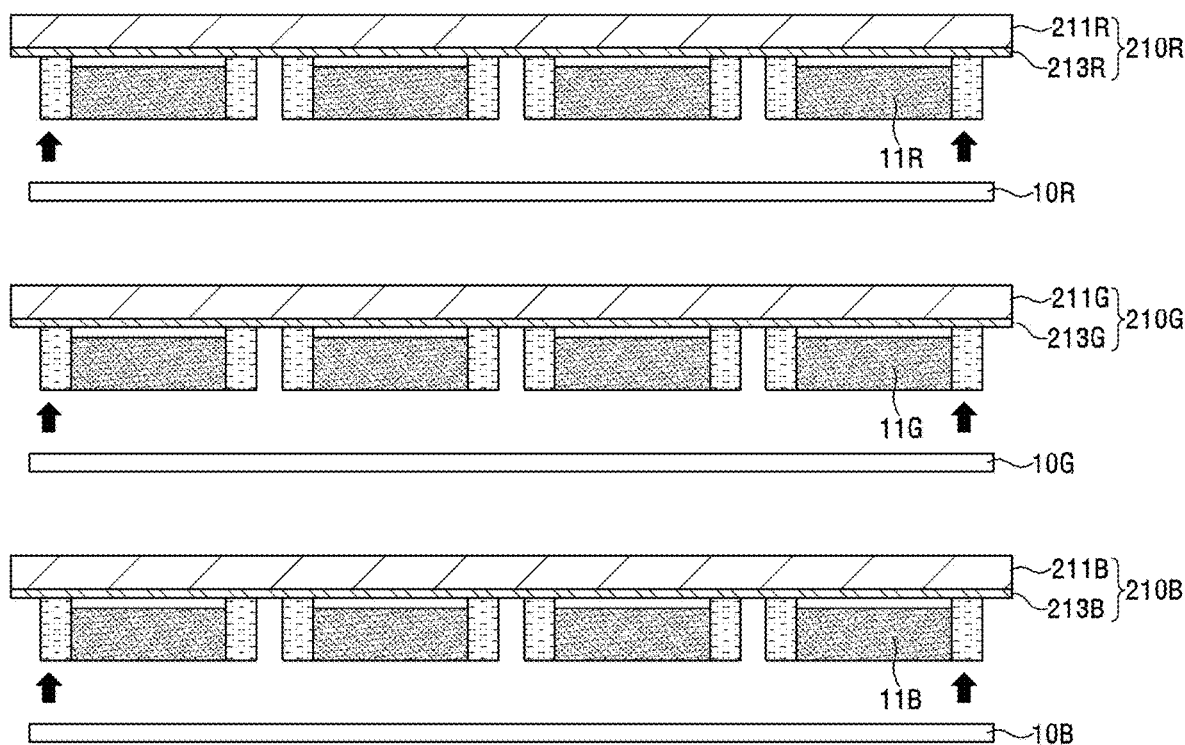
FIG. 12 is a process diagram of removing a wafer by an LLO technique.

FIG. 11 is a process diagram of transferring the etched chip of FIG. 8 from the wafer to the first carrier substrate, and FIG. 12 is a process diagram of removing the wafer by an LLO technique. FIGS. 11 and 12 are processes for removing wafers 10R, 10G, and 10B to transfer the etched chip to the first carrier substrate 210R. The first carrier substrate 210R may have the same configuration as the transfer apparatus of FIG. 4.

Referring to FIG. 11, after the chip is separated in a matrix direction by etching (as shown in FIG. 10), the first carrier substrates 210R, 210G, and 210B are attached to LED chips 100R, 100G, and 100B in opposite directions of the wafers 10R, 10G, and 10B. That is, the first carrier substrates 210R, 210G, and 210B are attached to the pads 14r, 14g, and 14b of the chips 100R, 100G, and 100B. The first carrier substrates 210R, 210G, and 210B include substrates 211R, 211G, and 211B and resin layers 213R, 213G, and 213B. The substrates 211R, 211G, and 211B may be made of any one of glass, quartz, artificial quartz, and metal, and the material is not particularly limited. The resin layers 213R, 213G, and 213B are photosensitive resin materials containing equal to or larger than 4 wt % of a photoactive agent.

Referring to FIG. 12, when the wafers 10R, 10G, and 10B are removed by a laser lift off (LLO) process in FIG. 11, the LED chips 100R, 100G, and 100B are placed attached to the first carrier substrate 210R, 210G, and in this case, the chips 100R, 100G, and 100B are arranged in such a direction that the light emitting body is exposed in the opposite direction. The first carrier substrates 210R, 210G, and 210B may include a first carrier substrate 210R on which an R LED chip array is formed, a first carrier substrate 210G on which a G LED chip array is formed, and a first carrier substrate 210B on which a B LED chip array is formed.

FIGS. 13 to 16 are exemplary diagrams for describing a process of selectively transferring the chip array shown in FIG. 7 from the first carrier substrate to the second carrier substrate. FIGS. 13 to 16 will be described based on only one of the RGB LED chips shown in FIGS. 9 to 12.

Figure 13:
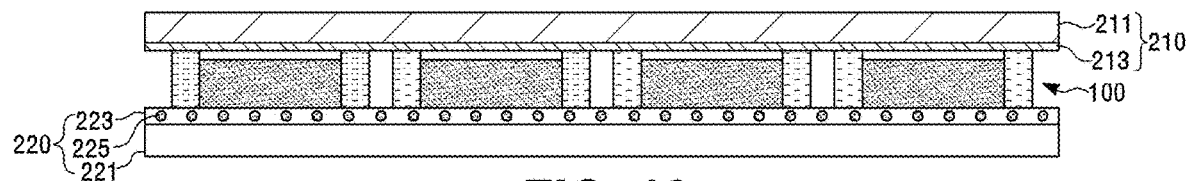
FIGS. 13 to 16 are process diagrams illustrating a process S160 of selectively transferring the chip array shown in FIG. 7 from the first carrier substrate to the second carrier substrate.

Referring to FIG. 13, a second carrier substrate 220 is disposed on the first carrier substrate 210 on which the LED chip array 100 is formed. The EMC adhesive layer 223 of the second carrier substrate 220 is brought into contact with the LED chips 100 to be attached to each other. Here, the second carrier substrate 220 may be formed of an EMC adhesive layer 223 including a glass substrate 221 and a foam 225. The foam 225 may be a micro-unit encapsulated foam material having foaming properties at a predetermined temperature. The expandable micro-capsule (EMC) adhesive layer 223 may be a resin obtained by mixing the foam 225 with an adhesive liquid.

Figure 14:
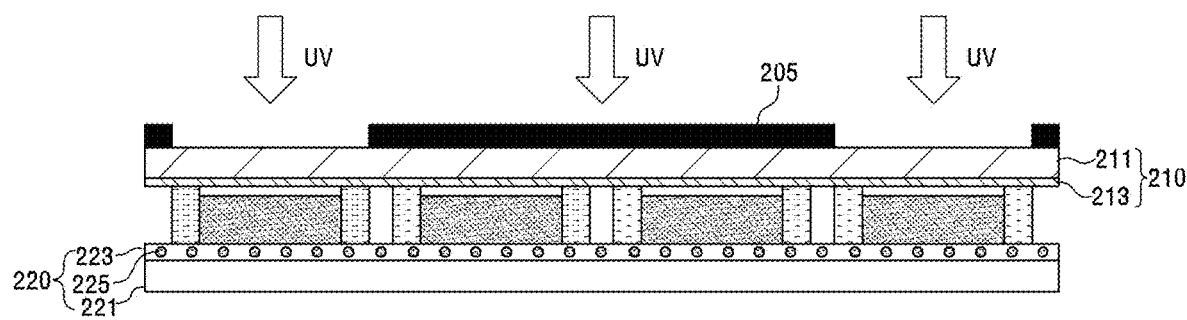

Referring to FIG. 14, a mask 205 is disposed on the rear surface of the glass substrate 211 of the first carrier substrate 210 in a state in which the first carrier substrate 210 and the second carrier substrate 220 are disposed to face each other with the LED chip 100 interposed therebetween as shown in FIG. 13. The mask 205 may be a pre-patterned mask. UV is irradiated while the mask 215 is disposed. Only a specific region of the photosensitive transfer resin layer 213 may be exposed by the mask 215 pattern and UV irradiation. Here, the degree of exposure of the 'exposure' may be adjusted according to the control of the UV exposure energy. The adjusted exposed portion of the photosensitive resin according to the amount of UV irradiation may be referred to as a photo-deteriorating (or photo-induced degradation) layer. As heat is applied to the photo-deteriorating layer, the resin expands and the adhesive force of the LED chip becomes zero, thereby selectively transferring only the LED chip at the corresponding position.

Figure 15:
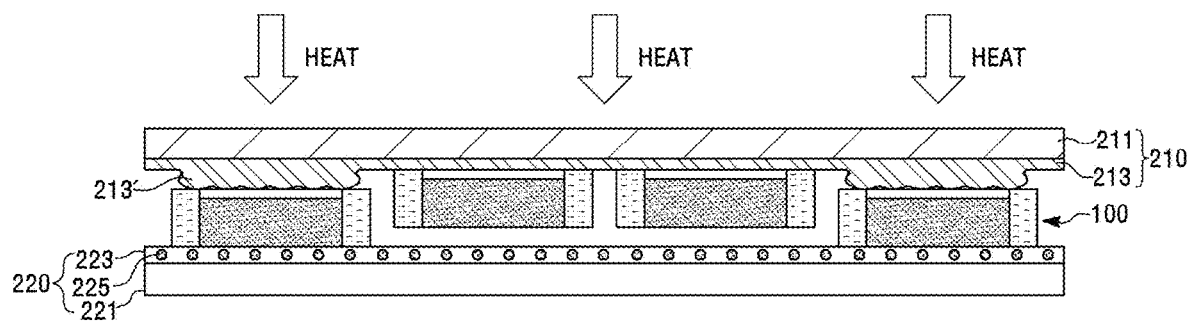

Referring to FIG. 15, heat is applied to an upper portion of the first carrier substrate 210. In this case, the heat may mean an expandable temperature of the resin layer 213. When the resin layer 213 reaches an expandable temperature by applying heat to the first carrier substrate 210, the resin layer 213 becomes a resin layer 213' in which the volume expands, and at this time, a position in which the volume expands may be the region where the photo-deteriorating layer which was provided in FIG. 12 exists. The expanded resin layer 213' increases in volume, pushing the LED chip 100 by pressure (expansion force) generated when the volume expands, reduces the adhesive force of the LED chip 100 to zero, and the LED chip 100 adhered to the corresponding position is peeled off (or transferred) to the second carrier substrate 220.

Figure 16:
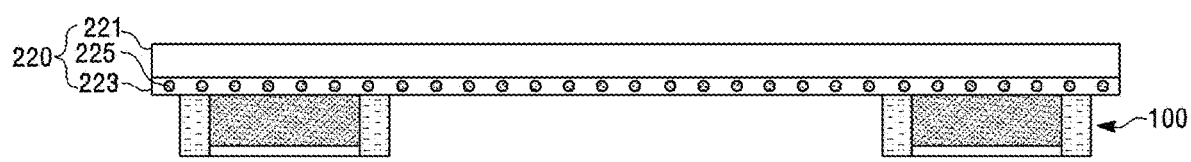

Referring to FIG. 16, a state in which only a specific LED chip 100 is selectively peeled off and transferred from the first carrier substrate 210 to the second carrier substrate 220 may be seen.

Figure 17A:
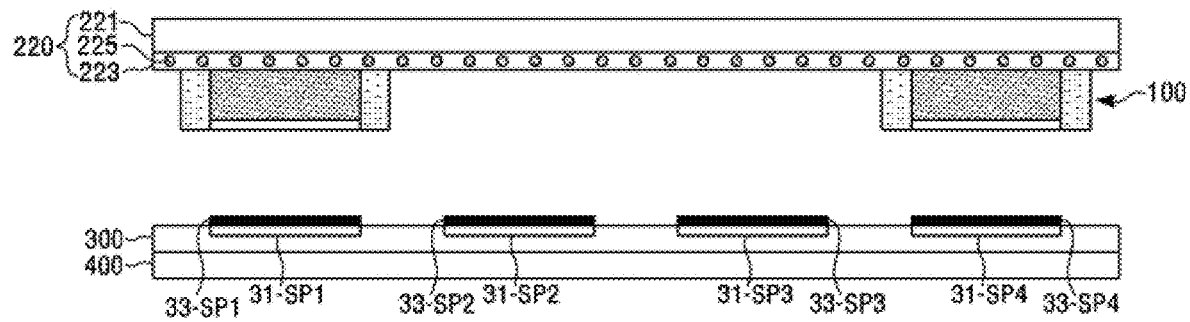
FIGS. 17A to 17C illustrate a process S170 in which the LED chip array is transferred from the second carrier substrate of FIG. 16 to the display panel.
Figure 17B:
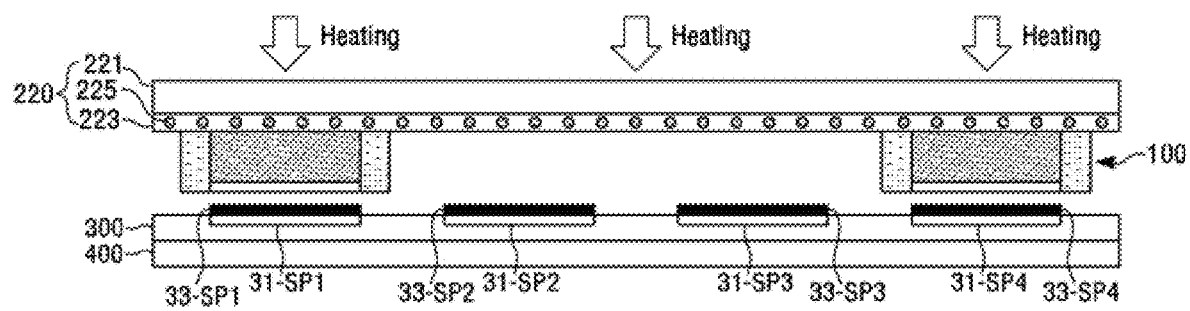
Figure 17C:
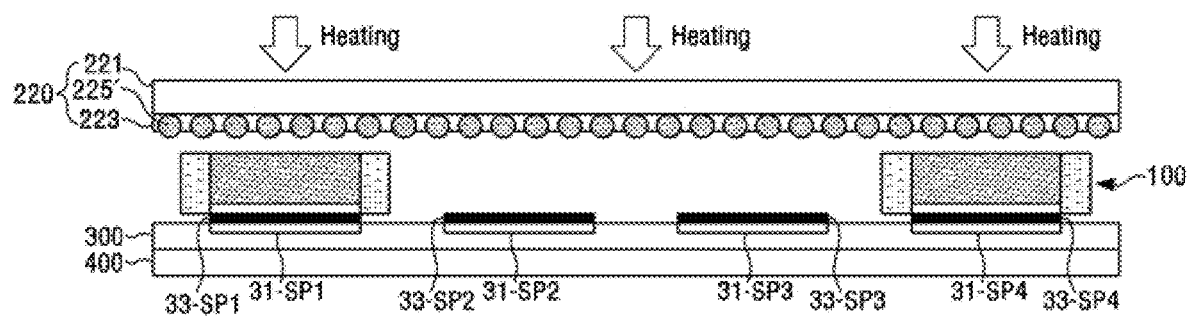

FIGS. 17A to 17C are cross-sectional process diagrams illustrating a process of transferring an LED chip array from the second carrier substrate 220 to a display panel 300.

Referring to FIG. 17A, a solder paste 33 is applied onto a plurality of pads 31 of the display panel 300. A TFT array substrate 400 may be disposed below the display panel 300. Here, the solder paste 33 may be applied on pads 31-SP1 to 31-SP4 in rows 1 to 4, or the solder paste 33 may be selectively applied only to pads at positions where the LED chip 100 is to be selected and transferred. The solder paste 33 may be applied on a plurality of pads 31 of the display panel 300 through various methods such as screen printing, dispensing, and jetting.

Next, referring to FIG. 17B, the LED chip array 100 attached to the second carrier substrate 220 is disposed on the display panel 300, and the pad of the LED chip array 100 is arranged at positions of solder paste 33-SP1 to 33-SP4 applied on the pad 31 of the display panel 300.

Next, referring to FIG. 17C, heat is applied from an upper portion of the second carrier substrate 220. In this case, heat refers to a temperature at which the foam 225 may be foamed. The foam 225 expands in volume by heat and loses adhesive force between the LED chip 100 and the second carrier substrate 220, so that, by pushing the EMC adhesive layer 223 including the impregnated adhesive liquid at a constant pressure, the LED chip 100 located on the line of the EMC adhesive layer 223 may be transferred onto the display panel 300. When these processes are repeatedly performed, it is possible to sequentially transfer R, G, and B LED chips sequentially to the display panel 300 in the order of time intervals.

Features, structures, effects, etc. described in embodiments are included in at least one embodiment of this invention and are not necessarily limited to one embodiment. Furthermore, the features, structures, effects, and the like illustrated in each embodiment may be implemented in combination or modification with respect to other embodiments by a person skilled in the art to which the embodiments belong. Therefore, it should be interpreted that the contents related to these combinations and modifications are included in the scope of the present invention.

In addition, although the embodiment has been mainly described above, this is merely an example and this invention is not limited, and it will be appreciated by a person skilled in the art that various modifications and applications not illustrated are possible within the scope not departing from the present invention. For example, each element specifically shown in the embodiment may be modified and implemented. And differences related to these modifications and applications should be interpreted as falling within the scope of the present invention as defined in the appended claims.

What is claimed is:

1. A resin for transferring an LED chip, which is prepared by mixing a base resin, an organic solvent, and a photoactive agent, and to transfer an LED chip to a substrate by making adhesive force of the LED chip adhered to the resin to be broken or offset by expanding the resin by heating after exposure by using expandability of the photoactive agent, wherein the transfer resin further includes a solvent, the base resin is 30 to 35 wt %, the organic solvent is 45 to 50 wt %, the solvent is 5 to 10 wt %, and the photoactive agent is 10 to 15 wt %.

2. The resin for transferring an LED chip of claim 1, wherein a specific region of the transfer resin is exposed by mask and UV irradiation to form a photo-deteriorating layer, and the photo-deteriorating layer is expanded by applying predetermined heat to selectively transfer only an LED chip located at the photo-deteriorating layer.

3. The resin for transferring an LED chip of claim 1, wherein the base resin is selected from at least one resin selected from a phenol resin, an epoxy resin, a UV resin, a polyester resin, a polyurethane resin, or an acrylic resin.

4. The resin for transferring an LED chip of claim 1, wherein the organic solvent is selected from at least one organic solvent selected from alcohols, petroleum-based materials, aromatic solvents, ketones, glycol ethers, acetates, and DMCs.

5. The resin for transferring an LED chip of claim 1, wherein a filler for reinforcing the adhesive force of the LED chip is added to the transfer resin.

6. A resin for transferring an LED chip of claim 1, which is prepared by mixing a base resin, an organic solvent, and a photoactive agent, and to transfer an LED chip to a substrate by making adhesive force of the LED chip adhered to the resin to be broken or offset by expanding the resin by heating after exposure by using expandability of the photoactive agent, wherein the photoactive agent is selected from Oxime-ester based, s-Triazine based, or Phosphineoxide based photoinitiators.

7. The resin for transferring an LED chip of claim 6, wherein a specific region of the transfer resin is exposed by mask and UV irradiation to form a photo-deteriorating layer, and the photo-deteriorating layer is expanded by applying predetermined heat to selectively transfer only an LED chip located at the photo-deteriorating layer.

8. The resin for transferring an LED chip of claim 6, wherein the transfer resin further includes a solvent, the base resin is 30 to 35 wt %, the organic solvent is 45 to 50 wt %, the solvent is 5 to 10 wt %, and the photoactive agent is 10 to 15 wt %.

9. The resin for transferring an LED chip of claim 6, wherein the base resin is selected from at least one resin selected from a phenol resin, an epoxy resin, a UV resin, a polyester resin, a polyurethane resin, or an acrylic resin.

10. The resin for transferring an LED chip of claim 6, wherein the organic solvent is selected from at least one organic solvent selected from alcohols, petroleum-based materials, aromatic solvents, ketones, glycol ethers, acetates, and DMCs.

11. The resin for transferring an LED chip of claim 6, wherein a filler for reinforcing the adhesive force of the LED chip is added to the transfer resin.

12. A resin for transferring an LED chip, which is prepared by mixing a base resin, an organic solvent, and a photoactive agent, and to transfer an LED chip to a substrate by making adhesive force of the LED chip adhered to the resin to be broken or offset by expanding the resin by heating after exposure by using expandability of the photoactive agent, wherein ultrapure (DI) water is added to the transfer resin.

13. The resin for transferring an LED chip of claim 12, wherein a specific region of the transfer resin is exposed by mask and UV irradiation to form a photo-deteriorating layer, and the photo-deteriorating layer is expanded by applying predetermined heat to selectively transfer only an LED chip located at the photo-deteriorating layer.

14. The resin for transferring an LED chip of claim 12, wherein the transfer resin further includes a solvent, the base resin is 30 to 35 wt %, the organic solvent is 45 to 50 wt %, the solvent is 5 to 10 wt %, and the photoactive agent is 10 to 15 wt %.

15. The resin for transferring an LED chip of claim 12, wherein the base resin is selected from at least one resin selected from a phenol resin, an epoxy resin, a UV resin, a polyester resin, a polyurethane resin, or an acrylic resin.

16. The resin for transferring an LED chip of claim 12, wherein the organic solvent is selected from at least one organic solvent selected from alcohols, petroleum-based materials, aromatic solvents, ketones, glycol ethers, acetates, and DMCs.

17. The resin for transferring an LED chip of claim 12, wherein a filler for reinforcing the adhesive force of the LED chip is added to the transfer resin.

\* \* \* \* \*